(12) United States Patent
Chen et al.

(10) Patent No.: US 8,724,044 B2
(45) Date of Patent: May 13, 2014

(54) LIQUID CRYSTAL DISPLAY BASED ON INSULATION BACKPLANE

(75) Inventors: Shihhsiang Chen, Shenzhen (CN); Chong Huang, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 229 days.

(21) Appl. No.: 13/378,846

(22) PCT Filed: Dec. 3, 2011

(86) PCT No.: PCT/CN2011/083423
§ 371 (c)(1),
(2), (4) Date: Dec. 16, 2011

(87) PCT Pub. No.: WO2013/063839
PCT Pub. Date: May 10, 2013

(65) Prior Publication Data
US 2013/0107158 A1    May 2, 2013

(30) Foreign Application Priority Data
Nov. 1, 2011  (CN) .......................... 2011 1 0339996

(51) Int. Cl.
*G02F 1/1333*    (2006.01)
(52) U.S. Cl.
USPC ......................................................... 349/58
(58) Field of Classification Search
USPC ......................................................... 349/58
See application file for complete search history.

(56) References Cited

U.S. PATENT DOCUMENTS

| 2001/0019377 A1* | 9/2001 | Fukayama et al. ............... 349/58 |
| 2004/0257515 A1* | 12/2004 | Lee ................................ 349/150 |
| 2009/0067112 A1* | 3/2009 | Takabayashi ................. 361/220 |
| 2009/0180048 A1* | 7/2009 | Kim et al. ........................ 349/58 |

FOREIGN PATENT DOCUMENTS

| CN | 1512225 A | 7/2004 |
| CN | 1550830 A | 12/2004 |
| CN | 1580889 A | 2/2005 |
| CN | 101153966 A | 4/2008 |

(Continued)

OTHER PUBLICATIONS

Zhang Peng, the first office action, Jan. 2013, CN.

(Continued)

*Primary Examiner* — Phu Vu
(74) *Attorney, Agent, or Firm* — IPro, Inc.; Na Xu

(57) ABSTRACT

The invention discloses a liquid crystal display (LCD) based on an insulation backplane. The LCD comprises a backplane, a display driving circuit board, and a metal front frame, wherein the backplane comprises a sidewall at the side surface of the LCD and a base plate at the bottom surface of the LCD; the metal front frame is fixedly connected with the sidewall of the backplane; and the display driving circuit board is fixed on the base plate. The LCD also comprises a metal insert, and the display driving circuit board is electrically connected with the metal front frame through the metal insert. In the invention, the display driving circuit board is connected with the metal front frame through the metal insert, compared with a conductive aluminum foil, the metal insert has higher strength and reliability, and the problems of falling, damage, tearing, etc. are not easy to occur. In addition, the metal insert can be assembled and disassembled as a whole conveniently, and thus, no additional trouble can be caused in the rework process.

9 Claims, 4 Drawing Sheets

(56) References Cited

FOREIGN PATENT DOCUMENTS

| | | |
|---|---|---|
| CN | 101464570 A | 6/2009 |
| CN | 101477262 A | 7/2009 |
| CN | 101571644 A | 11/2009 |
| CN | 101799594 A | 8/2010 |
| CN | 102007522 A | 4/2011 |
| JP | 2005-55925 A | 3/2005 |
| JP | 2007086408 A | 4/2007 |
| JP | 2009237220 A | 10/2009 |
| KR | 20060112142 A | 10/2006 |

OTHER PUBLICATIONS

Zhou Yu, the International Searching Authority written comments, Jun. 2012, CN.

* cited by examiner

LIQUID CRYSTAL DISPLAY BASED ON INSULATION BACKPLANE

TECHNICAL FIELD

The invention relates to the field of liquid crystal display, and more particularly to a liquid crystal display (LCD) based on an insulation backplane.

BACKGROUND

With the maturity of technique and the reduction of cost, LCDs become a main product in the display market. However, the liquid crystal can not give out light, and therefore, the existing liquid crystal module adopts a back light to supply light to display an image. A plastic backplane of a back light module uses a metal plastic backplane (such as SECC, AL, etc.) or a plastic backplane. The plastic backplane has the advantage that the weight of the module can be reduced, and therefore, a plastic backplane design is adopted by certain devices.

The existing design concept of a back light module adopting a plastic backplane design includes: a display driving circuit board (X-PWB) on an LCD panel is fixed between a front frame (Bezel) and a plastic backplane on the side of a source end. Specifically, the side surface of the LCD panel is provided with the side wall of the plastic backplane and a front frame board of the front frame in sequence, and the display driving circuit board (X-PWB) is arranged between the two. However, with the thin design trend of the liquid crystal module, the thickness of the liquid crystal module becomes thinner, but the width of the display driving circuit board (X-PWB) cannot be further decreased. Therefore, the display driving circuit board (X-PWB) on the LCD panel needs to be fixed by bending to the back surface of the plastic backplane, i.e. the display driving circuit board (X-PWB) is arranged on the base plate of the plastic backplane. In use of the plastic backplane, when the display driving circuit board (X-PWB) is locked by using a screw rod, the display driving circuit board (X-PWB) cannot be electrically connected with the metal front frame (Bezel), and thus, the display driving circuit board (X-PWB) can not be grounded effectively.

Conventional solutions are to attach a conductive aluminum foil between the display driving circuit board (X-PWB) and the metal front frame (Bezel), but the conductive aluminum foil may fall, resulting in failure to grounding and affecting module electricity. Moreover, when the LED is reworked, the aluminum foil must be removed and then be attached again after rework, which is very inconvenient.

SUMMARY

The aim of the invention is to provide an LCD based on an insulation backplane, of which a display driving circuit board can be reliably grounded and disassembled and assembled conveniently.

The aim of the invention is achieved by the following technical schemes:

An LCD based on an insulation backplane comprises a backplane, a display driving circuit board, a metal front frame, and a metal insert. The backplane comprises a sidewall at the side surface of the LCD and a base plate at the bottom surface of the LCD; the metal front frame is fixedly connected with the sidewall of the backplane; the display driving circuit board is fixed on the base plate; and the display driving circuit board is electrically connected with the metal front frame through the metal insert.

Preferably, the metal insert comprises a first insert and a second insert that are electrically connected with each other; the first insert is electrically connected with the metal front frame; and the second insert is electrically connected with the display driving circuit board. This is an example of the metal insert. Because a certain angle is formed between the metal front frame and the display driving circuit board, the electrically connected first insert and second insert are adopted to connect with the metal front frame and the display driving circuit board respectively, which can save space and is favorable to reduce the weight and the thickness of the LCD.

Preferably, the sidewall of the backplane is provided with a hollow area, and the first insert is embedded in the hollow area to fix the metal insert to the backplane. This is one example of a connection structure of the metal insert and the backplane, and the metal insert can be inserted and removed from the back surface of the backplane, which provides convenience for disassembling and assembling the metal insert.

Preferably, the outside of the sidewall of the backplane is provided with a clamping plate parallel to the sidewall of the backplane, and the hollow area is formed between the clamping plate and the sidewall of the backplane. This is an example of the hollow area structure. The hollow area is in a semi-open state, which provides convenience for examining and adjusting the embedding condition of the metal insert.

Preferably, the first insert and the hollow area are positioned through bumps or concave holes matched in pairs. The first insert and the hollow area are clamped through the bumps stamped on the metal insert, and are fixed by interference fitting. The metal insert can be withdrawn by increasing strength to drive the bumps to slide out of the concave hole, and then the metal insert can be removed, which is convenient to use. Through positioning, falling of the metal insert can be prevented effectively on one hand, and on the other hand, the metal insert can be aligned conveniently. For example, if the metal insert is provided with a screw rod hole for fixing a screw rod, the hollow area has a corresponding through hole so that the screw rod can enter from outside. This requires that the through hole and the screw rod hole align well to allow the screw rod to enter. However, the hollow area is relatively sealed, and the alignment condition is not easy to be examined, so the positioning structure can correspond to the position of the through hole. As long as the metal insert is in the positioning position, the through hole and the screw rod hole can be aligned correctly.

Preferably, the first insert is bent on the end away from the second insert to form a bending part, and the bending part clamps the two side surfaces of the hollow area to position the metal insert. The metal insert is positioned through the metal elastic stress of the first insert, and can also be removed conveniently. Through positioning, falling of the metal insert can be prevented effectively on one hand, and on the other hand, the metal insert can be aligned conveniently. For example, if the metal insert is provided with a screw rod hole for fixing a screw rod, the hollow area has a corresponding through hole so that the screw rod can enter from outside. This requires that the through hole and the screw rod hole align well to allow the screw rod to enter. However, the hollow area is relatively sealed, and the alignment condition is not easy to be examined, so the positioning structure can correspond to the position of the through hole. As long as the metal insert is in the positioning position, the through hole and the screw rod hole can be aligned correctly.

Preferably, the first insert is fixed on and electrically connected with the metal front frame through a screw rod. This is an example of an electrical connection mode of the first insert and the metal front frame.

Preferably, the first insert is embedded into the front frame on the end away from the second insert to achieve an electrical connection. This is another example of an electrical connection mode of the first insert and the metal front frame. When the metal front frame and the backplane are not fixed by a screw rod while adopting other means, such as a clamping claw, etc., to achieve an electrical connection of the first insert and the metal front frame, the end of the first insert embedded into the hollow area can be extended to the top of the hollow area to be directly embedded into the metal front frame.

Preferably, the second insert is fixed on and electrically connected with the display driving circuit board through a screw rod. This is an example of an electrical connection mode of the second insert and the display driving circuit board.

Preferably, the second insert is provided with a conductive bump at a position corresponding to a copper exposed area of the display driving circuit board, and the conductive bump is in contact with the copper exposed area of the display driving circuit board to achieve an electrical connection. This is another example of an electrical connection mode of the second insert and the display driving circuit board.

In the invention, the display driving circuit board is connected with the metal front frame through the metal insert, compared with a conductive aluminum foil, the metal insert has a higher strength and reliability, and the problems of falling, damage, tearing, etc. are not easy to occur. In addition, the metal insert can be assembled and disassembled as a whole conveniently, and thus, no additional trouble can be caused in the rework process.

Figure 1:
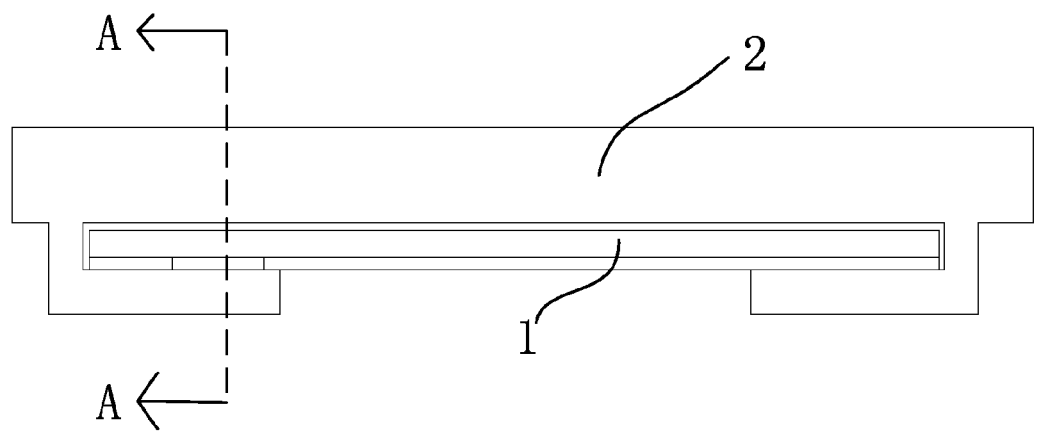
FIG. 1 is a top view of the invention.

Wherein: 1, metal insert; 11, first insert; 12, second insert; 13, concave hole; 14, bending part; 15, conductive bump; 16, lug; 2, backplane; 21, sidewall of backplane; 22, clamping plate; 23, back surface; 24, bump; 3, metal front frame; 31, front frame board; 32, side frame board; 4, display driving circuit board; 5, screw rod.

DETAILED DESCRIPTION

The invention is further described by figures and the preferred embodiments as follows.

An LCD comprises an LCD panel and a backlight module. The LCD panel comprises a display driving circuit board 4 for driving liquid crystal display. The LCD panel and the backlight module are fixed through a backplane 2 and a metal front frame 3. The backplane 2 is made from non-conductive materials, such as plastics, etc. The metal front frame 3 is L-shaped and located at the external layer of the LCD, and comprises a front frame board 31 and a side frame board 32 that are connected with each other. The side frame board 32 is located outside the sidewall 21 of the backplane. The front frame board 31 leans against the end part of the sidewall 21 of the backplane. Thus, the metal front frame 3 covers the sidewall 21 of the backplane. The display driving circuit board 4 is fixed by bending to the back surface 23 of the backplane 2. The display driving circuit board 4 is fixed on the metal front frame 3 via a metal insert 1. The conception of the invention is further interpreted by specific embodiment as follows:

Embodiment 1

As shown in FIGS. 1-4, one surface of the sidewall 21 of the backplane, which is opposite to the side frame board 32 of the metal front frame 3, i.e. the outside of the sidewall 21 of the backplane, is provided with a clamping plate 22, and a hollow area is formed between the clamping plate 22 and the bottom surface. The metal insert 1 is L-shaped, which comprises a first insert 11 and a second insert 12 that are electrically connected with each other. The first insert 11 is embedded into the hollow area of the backplane 2, and the second insert 12 is opposite to the bottom surface of the backplane 2.

Figure 2:
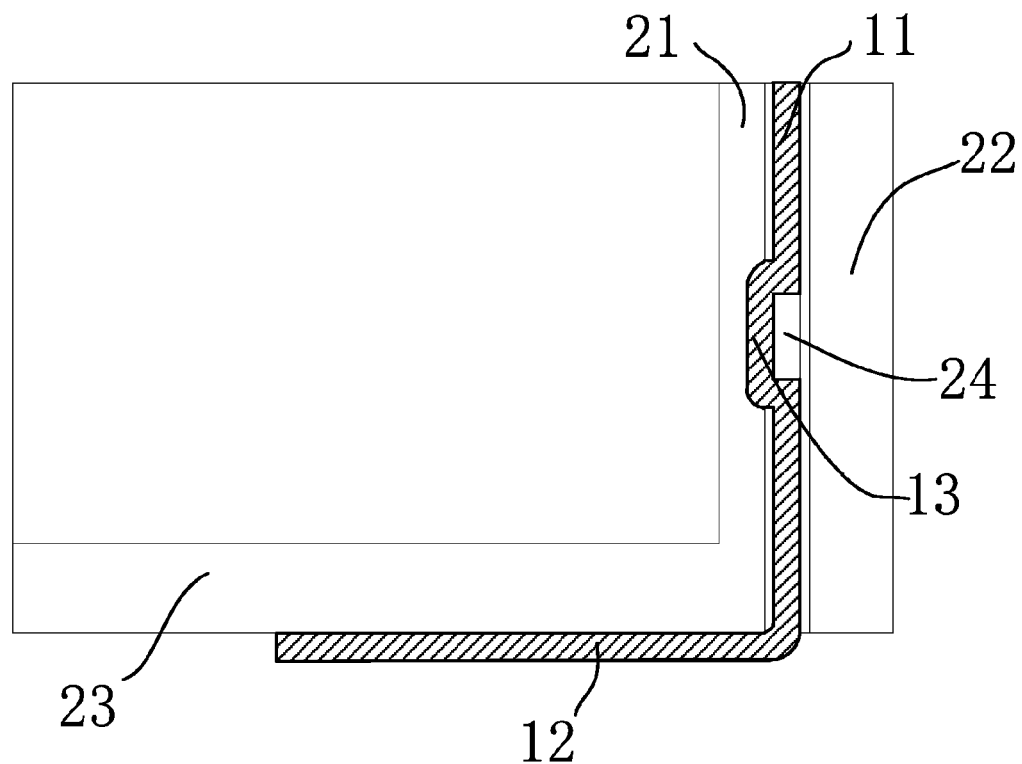
FIG. 2 is an A-A section view of FIG. 1.
Figure 3:
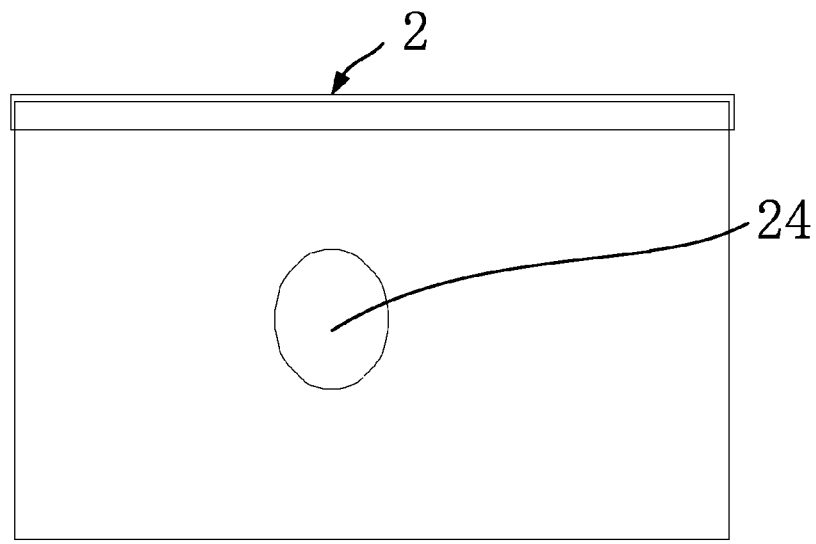
FIG. 3 is a schematic diagram of a backplane.
Figure 4:
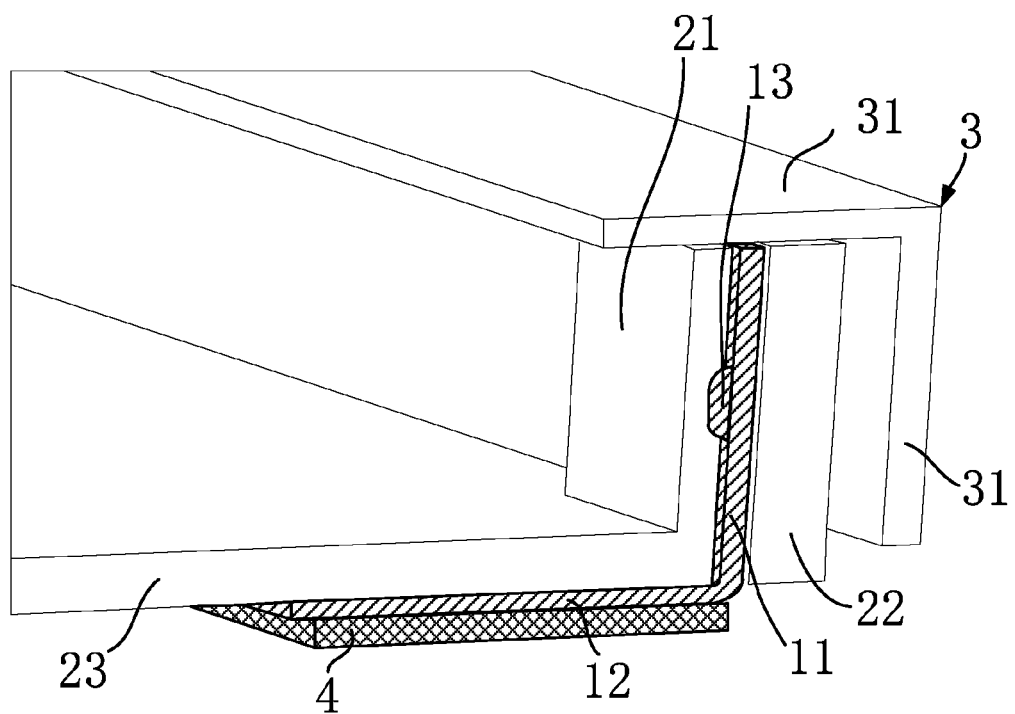
FIG. 4 is a three-dimensional diagram of a positioning structure of a metal insert of the invention.

Positioning structures for fixing the metal insert 1 are arranged between the first insert 11 and the hollow area. The positioning structures are bumps 24 or concave holes 13 matched in pairs and arranged on the contact surfaces of the first insert 11 and the hollow area. As shown in FIGS. 2-4, the inside of the hollow area is provided with a bump 24, and correspondingly, the first insert 11 is provided with a concave hole 13. During installation, the first insert 11 is guided to the hollow area from the back surface 23 of the backplane 2, and the bump 24 slides to the concave hole 13 to achieve reliable positioning. In addition, the metal insert 1 can be withdrawn by increasing strength to drive the bump 24 to slide out of the concave hole 13, and then the metal insert 1 can be removed, which is convenient to use. If the bump 24 is arranged on the sidewall 21 of the backplane, the concave hole 13 is arranged on the first insert 11; if the bump 24 is arranged on the first insert 11, the concave hole 13 is arranged in the hollow area or on the sidewall 21 of the backplane correspondingly, and the two conditions have the same effect.

Figure 5:
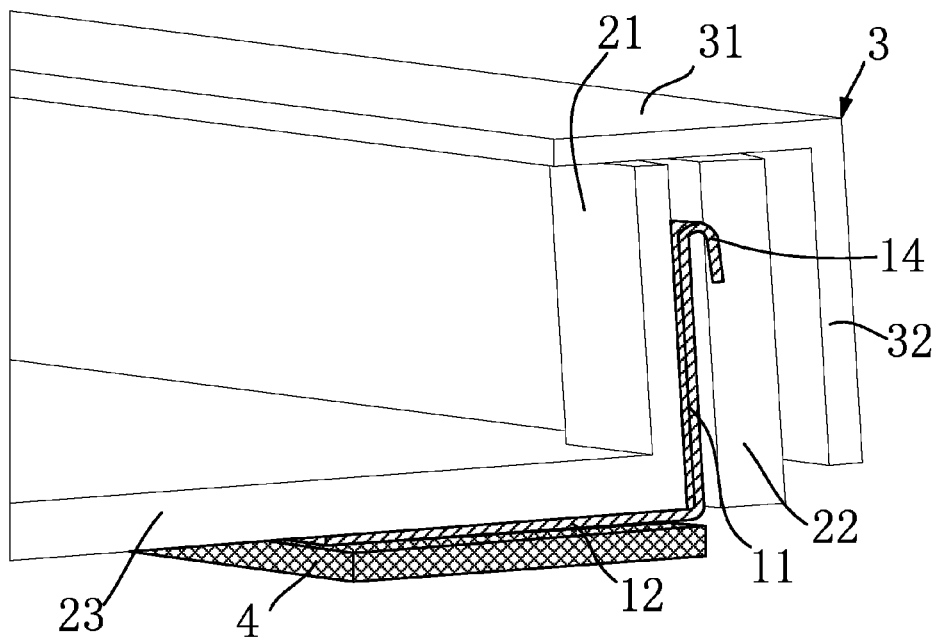
FIG. 5 is another three-dimensional diagram of a positioning structure of a metal insert of the invention.

Another positioning structure is described as follows. As shown in FIG. 5, the positioning structure has the characteristic that, one end of the first insert 11, away from the second insert 12, is bent to form a bending part 14, and the width of the bending part 14 is greater than that of the hollow area. Therefore, when the first insert 11 is guided to the hollow area, the bending area 14 has an elastic deformation to adapt to the width of the hollow area, and the produced elastic stress supports the two side surfaces of the hollow area, thereby achieving the positioning of the metal insert 1 and convenient disassembly.

Figure 6:
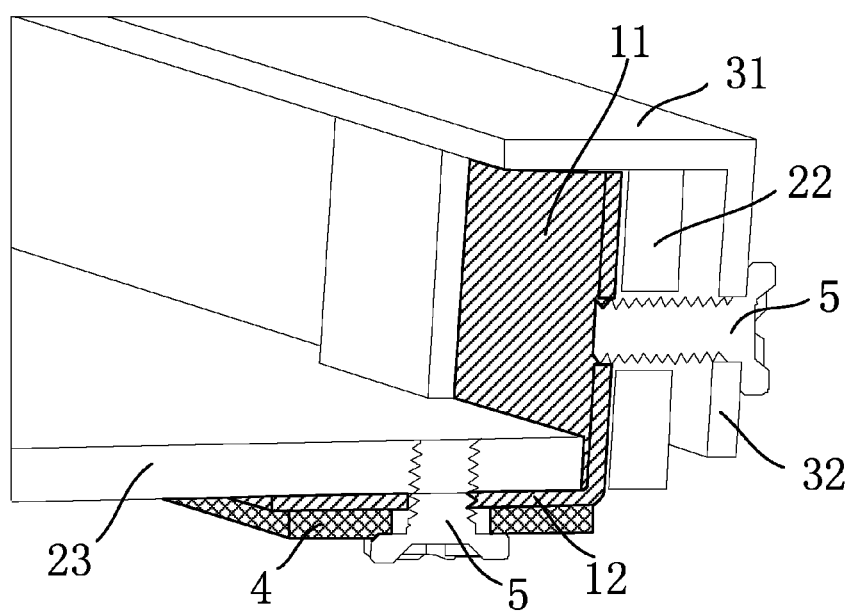
FIG. 6 is a three-dimensional diagram of a first embodiment of the invention.
Figure 7:
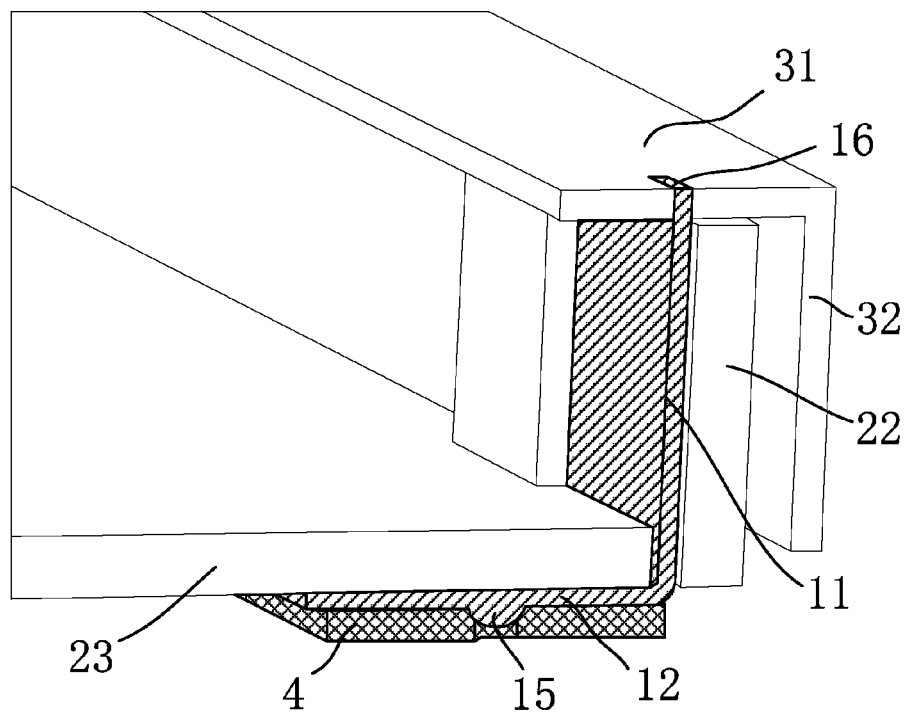
FIG. 7 is a three-dimensional diagram of a second embodiment of the invention.

As shown in FIG. 6 and FIG. 7, the metal insert 1 is electrically connected with the display driving circuit board 4 and the metal front frame 3 through a screw rod 5. The first insert 11 is provided with a screw rod hole, and the inside of the hollow area has a corresponding through hole or a screw rod hole. The screw rod 5 is screwed in the screw rod hole on the first insert 11 by passing the through hole or the screw rod hole on the metal front frame 3 and the hollow area to achieve an electrical connection of the first insert 11 and the metal front frame 3 and the fixing of the metal front frame 3 and the backplane 2. One surface of the second insert 12 is closely attached to the back surface 23 of the backplane 2, and the other surface is in contact with the display driving circuit board 4. The second insert 12 is provided with a screw rod hole, and the backplane 2 and the display driving circuit board 4 are provided with corresponding through hole or screw rod hole. The electrical connection of the second insert 12 and the display driving circuit board 4 can be achieved through the tightening of the screw rod 5, thereby achieving electrical connection of the second insert 12 and the metal front frame 3 and reliable grounding. The second insert 12 and the display driving circuit board 4 can also achieve an electrical connection by adopting a conductive bump 15 described in the embodiment 2.

Embodiment 2

As shown in FIGS. 1-4, one surface of the sidewall 21 of the backplane, which is opposite to the side frame board 32 of the metal front frame 3, i.e. the outside of the sidewall 21 of the backplane, is provided with a clamping plate 22 parallel to the sidewall of the backplane, and a hollow area is formed between the clamping plate 22 and the bottom surface. The metal insert 1 is L-shaped, which comprises a first insert 11 and a second insert 12 that are electrically connected with each other. The first insert 11 is embedded into the hollow area of the backplane 2, and the second insert 12 is opposite to the bottom surface of the backplane 2.

Positioning structures for fixing the metal insert 1 are arranged between the first insert 11 and the hollow area. The positioning structures are bumps 24 or concave holes 13 matched in pairs and arranged on the contact surfaces of the first insert 11 and the hollow area. As shown in FIGS. 2-4, the inside of the hollow area is provided with a bump 24, and correspondingly, the first insert 11 is provided with a concave hole 13. During installation, the first insert 11 is guided to the hollow area from the back surface 23 of the backplane 2, and the bump 24 slides to the concave hole 13 to achieve reliable positioning. In addition, the metal insert 1 can be withdrawn by increasing strength to drive the bump 24 to slide out of the concave hole 13, and then the metal insert 1 can be removed, which is convenient to use. If the bump 24 is arranged on the sidewall 21 of the backplane, the concave hole 13 is arranged on the first insert 11; if the bump 24 is arranged on the first insert 11, the concave hole 13 is arranged in the hollow area or on the sidewall 21 of the backplane correspondingly, and the two conditions have the same effect.

Another positioning structure is described as follows. As shown in FIG. 5, the positioning structure has the characteristic that, one end of the first insert 11, away from the second insert 12, is bent to form a bending part 14, and the width of the bending part 14 is greater than that of the hollow area. Therefore, when the first insert 11 is guided to the hollow area, the bending area 14 has an elastic deformation to adapt to the width of the hollow area, and the produced elastic stress supports the two side surfaces of the hollow area, thereby achieving the positioning of the metal insert 1 and convenient disassembly.

Figure 8:
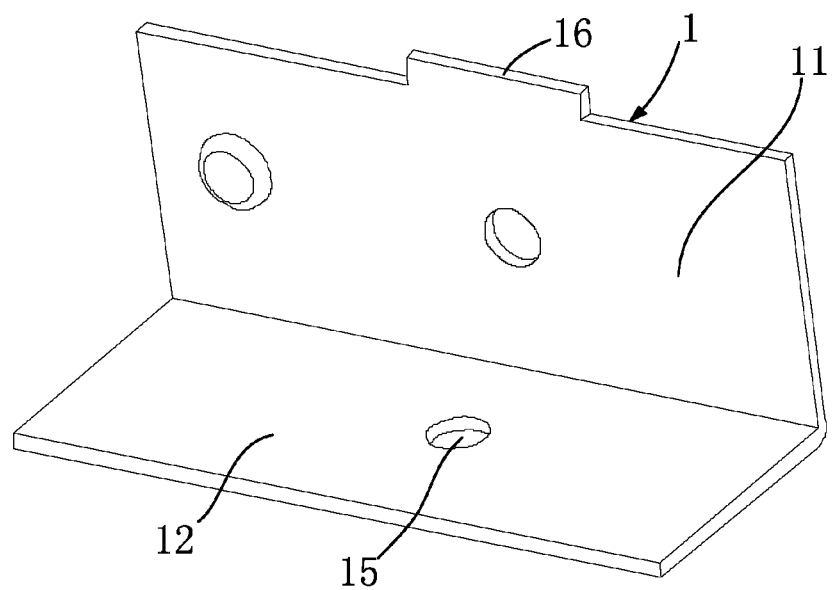
FIG. 8 is a structural diagram of a metal insert in a second embodiment of the invention.

As shown in FIG. 7 and FIG. 8, the backplane 2 and the metal front frame 3 are fixed by a clamping claw, etc. other than the screw rod 5. One end of the first insert 11, away from the second 12, is provided with a bump 16, and the bump 16 is embedded into the front frame board 31 of the metal front frame 3 from the end part of the sidewall 21 of the backplane, thereby achieving an electrical connection of the first insert 11 and the metal front frame 3. One surface of the second insert 12 is closely attached to the back surface 23 of the backplane 2, and the other surface is in contact with the display driving circuit board 4. The second insert 12 is provided with a conductive bump 15 at a position corresponding to the copper exposed area of the display driving circuit board 4. The conductive bump 15 is in contact with the copper exposed area of the display driving circuit board 4 to achieve a reliable electrical connection, thereby achieving an electrical connection of the display driving circuit board 4 and the metal front frame 3 and reliable grounding. The second insert 12 and the display driving circuit board 4 can also achieve an electrical connection by adopting the screw rod 5 described in the embodiment 1.

The invention is described in detail in accordance with the above contents with the specific preferred embodiments. However, this invention is not limited to the specific embodiments. For the ordinary technical personnel in the technical field of the invention, on the premise of keeping the conception of the invention, the technical personnel can also make simple deductions or replacements, and all of which should be considered to belong to the protection scope of the invention.

We claim:

1. A liquid crystal display (LCD) based on an insulation backplane, comprising: a backplane, a display driving circuit board, a metal front frame, and a metal insert; wherein the backplane comprises a sidewall at a side surface of the LCD and a base plate at a bottom surface of the LCD; the metal front frame is fixedly connected with the sidewall of the backplane; the display driving circuit board is fixed on the base plate; and the display driving circuit board is electrically connected with the metal front frame through the metal insert; and wherein the metal insert comprises a first insert and a second insert electrically connected with the first insert, the first insert is located between the sidewall of the backplane and the metal front frame, and is electrically connected with the metal front frame, and the second insert is electrically connected with the display driving circuit board.

2. The LCD of claim 1, wherein the sidewall of the backplane is provided with a hollow area; and the first insert is embedded in the hollow area to fix the metal insert to the backplane.

3. The LCD of claim 2, wherein the outside of the sidewall of the backplane is provided with a clamping plate parallel to the sidewall of the backplane; and the hollow area is formed between the clamping plate and the sidewall of the backplane.

4. The LCD of claim 2, wherein the first insert and the hollow area are positioned through bumps or concave holes matched in pairs.

5. The LCD of claim 2, wherein the first insert is bent on the end away from the second insert to form a bending part; and the bending part clamps the two side surfaces of the hollow area to position the metal insert.

6. The LCD of claim 1, wherein the first insert is fixed on and electrically connected with the metal front frame through a screw rod.

7. The LCD of claim 1, wherein the first insert is embedded into the metal front frame on the end away from the second insert to achieve an electrical connection.

8. The LCD of claim 1, wherein the second insert is fixed on and electrically connected with the display driving circuit board through a screw rod.

9. The LCD of claim 1, wherein the second insert is provided with a conductive bump at a position corresponding to a copper exposed area of the display driving circuit board; and the conductive bump electrically connects to the copper exposed area of the display driving circuit board.

* * * * *